(12) United States Patent
Choi et al.

(10) Patent No.: US 7,736,836 B2
(45) Date of Patent: Jun. 15, 2010

(54) SLIP FILM COMPOSITIONS CONTAINING LAYERED SILICATES

(76) Inventors: Jonghan Choi, 3375 Spring Hill, Parkway SE. #1008, Smyrna, GA (US) 30080; Ryan Vest, 3420 Canyon Oak Way, Cumming, GA (US) 30041

(*) Notice: Subject to any disclaimer, the term of this patent is extended or adjusted under 35 U.S.C. 154(b) by 939 days.

(21) Appl. No.: 10/946,937

(22) Filed: Sep. 22, 2004

(65) Prior Publication Data

US 2006/0063109 A1    Mar. 23, 2006

(51) Int. Cl.
- G03C 1/00 (2006.01)
- G03F 7/00 (2006.01)
- G03F 7/26 (2006.01)

(52) U.S. Cl. .................. 430/270.1; 430/273.1; 430/302
(58) Field of Classification Search .............. 430/270.1, 430/109.5, 300, 273.1, 302; 524/425; 428/1.33
See application file for complete search history.

(56) References Cited

U.S. PATENT DOCUMENTS

| | | | |
|---|---|---|---|
| 3,265,765 A | 8/1966 | Holden et al. | |
| 3,867,153 A | 2/1975 | MacLachlan | |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,423,135 A | 12/1983 | Chen et al. | |
| 4,427,759 A | 1/1984 | Gruetzmacher et al. | |
| 4,622,088 A | 11/1986 | Min | |
| 4,778,654 A | 10/1988 | Bacskai et al. | |
| 5,006,447 A | 4/1991 | Umeda et al. | |
| 5,039,592 A | 8/1991 | Umeda | |
| 5,057,152 A * | 10/1991 | Marcus et al. ................. 106/3 |
| 5,135,827 A | 8/1992 | Bohm et al. | |
| 5,223,375 A | 6/1993 | Berrier et al. | |
| 5,262,275 A | 11/1993 | Fan | |
| 5,506,086 A | 4/1996 | Van Zoeren | |
| 5,679,485 A | 10/1997 | Suzuki et al. | |
| 5,925,500 A | 7/1999 | Yang et al. | |
| 6,106,997 A * | 8/2000 | Oguni et al. .............. 430/272.1 |
| 6,228,904 B1 | 5/2001 | Yadav et al. | |
| 6,238,837 B1 | 5/2001 | Fan | |
| 6,245,421 B1 * | 6/2001 | Aurenty et al. .......... 428/304.4 |
| 6,395,459 B1 * | 5/2002 | Taylor et al. ................ 430/434 |
| 6,399,270 B1 * | 6/2002 | Mori et al. ............... 430/270.1 |
| 6,410,635 B1 | 6/2002 | Kaylo et al. | |

(Continued)

FOREIGN PATENT DOCUMENTS

EP    577385 A1 *  1/1994

(Continued)

Primary Examiner—Cynthia H Kelly
Assistant Examiner—Connie P Johnson
(74) Attorney, Agent, or Firm—Carmody & Torrance LLP (57) ABSTRACT

The present invention relates to an improved slip film composition for use in manufacturing flexographic printing plates. The improved slip film composition of the invention comprises one or more solvents, one or more polymeric binders, a layered silicate, and optionally, a surfactant. The use of the layered silicate as a filler in the slip film composition produces an slip film composition with improved release properties and improved imaging. The slip film of the invention can be used with flexographic printing plates that are solvent developed or thermally developed.

11 Claims, 4 Drawing Sheets

Reverse depth (15 mil.) vs. exposure time as a function of 2% Cloisite nanoclays.

U.S. PATENT DOCUMENTS

| | | | | |
|---|---|---|---|---|
| 6,423,379 B1 * | 7/2002 | Ewing | | 427/387 |
| 6,765,049 B2 * | 7/2004 | Lorah et al. | | 524/445 |
| 6,864,038 B2 * | 3/2005 | Mori | | 430/271.1 |
| 7,108,959 B2 * | 9/2006 | Maehashi | | 430/271.1 |
| 2001/0016558 A1 * | 8/2001 | Yagi et al. | | 503/227 |
| 2002/0028288 A1 * | 3/2002 | Rohrbaugh et al. | | 427/180 |
| 2003/0083397 A1 * | 5/2003 | Bradford et al. | | 522/173 |
| 2003/0138608 A1 * | 7/2003 | Landry-Coltrain et al. | | 428/195 |
| 2004/0052957 A1 * | 3/2004 | Cramer et al. | | 427/421 |
| 2004/0131974 A1 * | 7/2004 | Suzuki | | 430/302 |
| 2004/0146806 A1 * | 7/2004 | Roberts et al. | | 430/287.1 |
| 2004/0168598 A1 * | 9/2004 | Sampei et al. | | 101/463.1 |
| 2004/0170920 A1 * | 9/2004 | Goto | | 430/271.1 |
| 2004/0192548 A1 * | 9/2004 | Hara | | 503/201 |
| 2005/0061183 A1 * | 3/2005 | Maehashi | | 101/453 |
| 2005/0171250 A1 * | 8/2005 | Hayes | | 524/47 |
| 2005/0209369 A1 * | 9/2005 | Hu et al. | | 523/177 |

FOREIGN PATENT DOCUMENTS

| | | |
|---|---|---|
| EP | 1 371 484 A2 | 12/2003 |
| WO | WO0197970 A1 * | 12/2001 |

* cited by examiner

Figure 1. Reverse depth (15 mil.) vs. exposure time as a function of 2% Cloisite nanoclays.

Figure 2. Reverse depth (15 mil.) vs. exposure time as a function of 8% Cloisite nanoclays.

Figure 3. Dot angles vs. exposure time as a function of 2% nanoclays.

Figure 4. Dot angles vs. exposure time as a fucntion of 8% Cloisite nanoclays.

US 7,736,836 B2

SLIP FILM COMPOSITIONS CONTAINING LAYERED SILICATES

FIELD OF THE INVENTION

The invention is directed to the use of nanoclays (layered silicates) in slip film compositions to improve release properties and/or thermal processing characteristics of the slip film layer of a flexographic printing element.

BACKGROUND OF THE INVENTION

Flexographic printing is widely used in the production of newspapers and in the decorative or functional printing of packaging media. Photosensitive printing plates have been developed to meet the demand for fast, inexpensive processing and long press runs.

The photosensitive printing element generally comprises a support layer, one or more photosensitive layers, a slip film release layer, and a protective cover sheet. The protective cover sheet is formed from plastic or any other removable material that can protect the plate or photocurable element from damage until it is ready for use. A slip film may be disposed between the protective cover sheet and the photocurable layer(s) to protect the plate from contamination, increase ease of handling, and/or act as an ink-accepting layer.

The photosensitive resin composition is deposited onto the support layer to later form a printing element. The photosensitive resin composition can be deposited onto the substrate in a variety of ways, e.g., by extrusion, roll coating, heat processing, solvent casting, and the like. These techniques can be readily carried out by those skilled in the art.

The desired image is produced on the printing plate by exposing selected portions of the photosensitive resin to actinic radiation, which is traditionally accomplished in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer, which is also sensitive to laser ablation. A laser is then used to ablate selected areas of the actinic radiation opaque layer creating an in situ negative, and the printing element is then flood exposed through the in situ negative. In the third alternative, a focused beam of actinic radiation is used to selectively expose the photopolymer. Any of these alternative methods produces an acceptable result, with the criteria being the ability to selectively expose the photopolymer to actinic radiation thereby selectively curing portions of the photopolymer. The unexposed and therefore unhardened portions of the resin are then developed.

The support sheet, or backing layer, can be formed from a suitable transparent or opaque material such as paper, cellulose film, plastic, or metal. Preferred substrate materials include steel, copper or aluminum sheets, plates, or foils, paper, or films or sheets made from synthetic polymeric materials such as polyesters, polystyrene, polyolefins, polyamides, and the like.

The photosensitive layer(s) can include any of the known photopolymers, monomers, initiators, reactive or non-reactive diluents, fillers, and dyes. The term "photocurable" refers to a solid composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzrnacher, et al., U.S. Pat. No. 4,622,088 to Min, and U.S. Pat. No. 5,135,827 to Bohm, et al., the subject matter of each of which is herein incorporated by reference in its entirety. If a second photocurable layer is used, i.e., an overcoat layer, it typically is disposed upon the first layer and is similar in composition.

The photosensitive materials generally cross-link (cure) and harden in at least some actinic wavelength region. As used herein, actinic radiation is radiation capable of effecting a chemical change in an exposed moiety. Actinic radiation includes, for example, amplified (e.g., laser) and non-amplified light, particularly in the UV wavelength regions. Preferred actinic wavelength regions are from about 250 nm to about 450 nm, more preferably from about 300 nm to about 400 nm, even more preferably from about 320 nm to about 380 nm. One suitable source of actinic radiation is a UV lamp, although other sources are generally known to those skilled in the art.

The slip film is a thin sheet, which protects the photosensitive layer from dust and increases its ease of handling. In a conventional plate making process, the slip film is substantially transparent to UV light. In this process, the printer peels the cover sheet off the printing plate blank, and places a negative on top of the slip film. The plate and negative are then subjected to flood-exposure by UV light through the negative. The areas exposed to the light cure, or harden, and the unexposed areas are removed (developed) to create the relief image on the printing plate. The slip film typically comprises a polymer resin that is compatible with the underlying photopolymer of the photosensitive layer and is easily removable during the development step. The polymer resin may be selected from the group consisting of polyacetals, polyacrylics, polyamides, polyimides, polybutylenes, polycarbonates, polyesters, polyethylenes, cellulosic polymers, polyphenylene ethers, polyethylene oxides, and combinations of the foregoing. Preferred polymer resins include polyamides, and cellulosic polymers, such as hydroxypropyl cellulose.

It is often desirable to use a slip film layer in a photosensitive printing element because the surface of the photosensitive composition tends to be sticky and, when an original film is applied thereon, bubbles are formed between the composition surface and the original film. When the photosensitive printing element is then exposed to actinic radiation, irregular deflection of light may occur, hindering the light exposure and curing of the photosensitive layer. Consequently, the reproducibility of the relief is deteriorated and the original film applied on the photosensitive layer becomes difficult to reuse. By adhering the slip film to the photosensitive resin layer, the adhesion of the original film to the photosensitive resin composition surface is mitigated and the original film can be reused.

In "digital" plate making processes, a laser is guided by an image stored in an electronic data file, and is used to create an in situ negative on a digital (i.e., laser ablatable) masking layer, which is generally a modified slip film. Portions of the laser ablatable layer are ablated by exposing the masking layer to laser radiation at a selected wavelength and power of the laser. The laser ablatable layer can be any photoablative masking layer known in the art. Examples of such laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety. The laser ablatable layer generally comprises a radiation absorbing compound and a binder. The radiation absorbing compound is chosen to be sensitive to the wavelength of the laser and is generally selected from dark inorganic pigments, carbon black, and graphite.

After imaging, the photosensitive printing element is developed to remove the masking layer and the unpolymerized portions of the layer of photocurable material to create a relief image on the surface of the photosensitive printing element. Typical methods of development include washing with various solvents or water, often with a brush. Other possibilities for development include the use of an air knife or heat plus a blotter Washing may be accomplished by a variety of processes, including brushing, spraying, or immersion. The resulting surface has a relief pattern that reproduces the image to be printed. The printing element is mounted on a press and printing commences.

In the case of heat or thermal development, the composition of the photopolymer is such that there exists a substantial difference in the melt temperature between the cured and uncured polymer to allow the creation of an image in the photopolymer when heated. Photocurable compositions that are thermally developable are described, for example, in U.S. patent application Ser. No. 10/353,446 filed Jan. 29, 2003, the teachings of which are incorporated herein by reference in their entirety. Other suitable compositions would also be known to those skilled in the art. The difference in melt temperature allows the uncured photopolymer to be selectively removed thereby creating an image. The uncured photopolymer (i.e., the portions of the photopolymer not contacted with actinic radiation) melts or substantially softens while the cured photopolymer will remain solid and intact at the temperature chosen. Then, uncured photopolymer can be melted or removed by contacting the heated printing element with a material that will absorb or otherwise remove the softened or melted uncured photopolymer (i.e., "blotting").

While many slip film compositions are described in the prior art, there remains a need in the art for further improvements to the slip films in the manufacture of flexographic printing plates to improve various processing characteristics of the printing plate.

The inventors have surprisingly discovered that the addition of a layered silicate material as a filler, more preferably a montmorillonite clay, into a slip film composition, produces a slip film composition with improved release properties for negative artwork and improved thermal processing characteristics as compared to slip film compositions of the prior art.

U.S. Pat. No. 5,039,592 to Umeda, the subject matter of which is herein incorporated by reference in its entirety describes a slip film composition that contains a dyestuff, especially a photobleaching dyestuff to control the amount of incident light and reflected light from the support at a relatively upper portion of the photosensitive layer and give a better quality image at a shadow area of the printing plate. However, Umeda do not describe any improvements in either the release properties of the slip film or the thermal processing characteristics of the slip film.

U.S. Pat. No. 5,506,086 to Van Zoeren, the subject matter of which is herein incorporated by reference in its entirety, describes a material capture sheet having one or more layers which assist in the capture of debris resulting from laser irradiation of an infrared sensitive layer. Optionally, the layer or layers on the material capture sheet can include a matte agent to create a separation gap between the infrared sensitive layer and the material capture sheet.

U.S. Pat. No. 6,410,635 to Kaylo et al., the subject matter of which is herein incorporated by reference in its entirety, generally describes compositions comprising an exfoliated silicate material (i.e., a montmorillonite clay) to enhance properties such as appearance, crater resistance, and rheology control. Kaylo et al. suggest that the compositions are particularly useful as color and/or clear coatings in color-clear composite coatings. However, Kaylo et al. do not suggest that the compositions are usable as slip film compositions for a flexographic printing plate.

SUMMARY OF THE INVENTION

The present invention is directed to a slip film composition for use in a flexographic printing plate. The slip film of the invention typically comprises:
   a) one or more polymeric binders;
   b) a layered silicate; and
   c) optionally, a surfactant.

The invention is also directed to a method of preparing a relief image printing plate comprising the steps of:
   a) providing a photosensitive printing element comprising:
      (i) a support layer;
      (ii) one or more layers of a photocurable material deposited on the support layer;
      (iii) a slip film layer positioned on the one or more layers of photocurable material, the release layers comprising:
         (a) one or more polymeric binders;
         (b) a layered silicate; and
         (c) optionally, a surfactant;
   b) placing imaging mask, such as negative art work, on top of the slip film layer of the photosensitive printing element;
   c) exposing the photosensitive printing element to actinic radiation through the imaging mask, wherein the areas of the one or more layers of photocurable material that are exposed to actinic radiation crosslink or cure; and
   d) developing the photosensitive printing element to remove uncured portions of the photocurable material to create a relief image on the printing plate.

BRIEF DESCRIPTION OF THE DRAWINGS

For a fuller understanding of the invention, reference is had to the following description taken in connection with the accompanying figures, in which.

DETAILED DESCRIPTION OF THE PREFERRED EMBODIMENTS OF THE INVENTION

The inventors have surprisingly discovered that the addition of a layered silicate as a filler into a slip film composition produces a slip film with improved release properties for negative artwork and improved thermal processing characteristics. Layered silicates (i.e., nanoclays) provide enhanced slip properties when utilized in the polymeric resin slip film layer utilized as the barrier layer between the photosensitive layer and the photographic negative.

Furthermore, the improved slip film composition of the invention also provides improved thermal processing characteristics when used in a thermally developable system. The addition of the layered silicate to the slip film composition provides the slip film layer with an effective filling agent, and the cohesiveness of the film formed by the polymer resin is thus altered. The ability to form microcracks in the surface, enabling proper release of the slip film from the photosensitive layer, is enhanced, enabling the photosensitive resin to be properly thermally processed. During thermal development, if the layered silicate is not used in the slip film layer, the polymer binder acts like a hot melt adhesive on top of the cured photosensitive layer, with adhesion that is too great so that either the photosensitive layer will not release or the blotter material itself sticks and then tears.

Another benefit of the improved slip film composition of the invention is that it provides for improved imaging of the printing plate as compared to photosensitive printing plates of the prior art.

To that end, the improved slip film composition of the invention typically comprises:
1) one or more polymer binders;
2) a layered silicate; and
3) optionally, a surfactant.

Various solvents are usable in compositions of the instant invention, including water and polyvinyl alcohol. Other suitable solvents would also be known to those skilled in the art. The solvent is typically initially present in the slip film composition in an amount of about 90% to about 95% by weight, based on the total weight of the slip film composition. The slip film composition is then coated onto the photopolymer layers and is dried by evaporating most or all of the solvent. In the alternative, a solventless slip film composition can be directly extruded onto the photopolymer layer.

The slip film composition also contains one or more polymer binders. Suitable polymer binders include polyacetals, polyacrylics, polyamides, polyimides, polybutylenes, polycarbonates, polyesters, polyethylenes, cellulosic polymers, polyphenylene ethers, polyethylene oxides, and combinations of the foregoing. Preferred polymer binders include polyamides, and cellulosic polymers, such as hydroxypropyl cellulose. The polymer binders are usable in the slip film composition of the invention in an amount between about 90% and 97% by weight, based on the total weight of the ingredients other than the solvent(s), if used.

The layered silicates are used in the slip film composition at a concentration of about 1% to about 10% by weight, more preferably about 2% to about 8% by weight, based on the total weight of the non-volatile (i.e. dry) ingredients.

Layered silicate materials suitable for use in the primer coating compositions of the invention include but are not limited to, phyllosilicates, such as smectite clay minerals, for example montmorillonite, particularly sodium montmorillonite, calcium montmorillonite and/or magnesium montmorillonite, nontronite, biedellite, volkonskonite, hectorite, saponite, sauconite, sobockite, stevensite, svinfordite, vermiculite and the like. Other useful layered materials include micaceous minerals such as illite and mixed layered illite/smectite minerals.

Preferred layered silicate materials are phyllosilicates. More preferably, the layered silicate materials are smectite clay minerals such as montmorillonite, nontronite, biedellite, volkonskonite, hectorite, saponite, sauconite, sobockite, stevensite, and svinfordite. The most preferred of these being montmorillonite materials. Commercially available montmorillonite materials are available from Southern Clay Products, Inc. under the tradename Cloisite®. Cloisite® $Na^+$ is a natural montmorillonite that does not contain an organic modifier. Cloisite® 15A and Cloisite® 25A are natural montmorillonites that have been modified with quaternary ammonium salts.

The modified slip film composition of the invention may optionally, but preferably contain a surfactant. One suitable surfactant that is usable in the invention is an ethoxylated nonyl phenol surfactant, available from Harcros Organics under the tradename T-Det-N 1007. If used, the surfactant is present in the slip film composition in an amount between about 0.5% and 1.0%, based on the total weight of the dry ingredients. The slip film may also advantageously contain dyes which are generally known in the art to produce latent images upon exposure to U.V. radiation and/or which decrease U.V. radiation scatter through the slip film.

The presence of nanoparticles, such as nanoclay particles in the slip film composition improves negative-artwork release, image quality and thickness uniformity. The presence of nanoclay particles enhanced negative-artwork release in all slip film compositions investigated. In addition, the reverse depths became larger at a given exposure time without adversely affecting the image speed. The dot angles increased rapidly and then leveled off with increasing exposure time, giving small dot angles at later stages. The thickness became more uniform throughout the slip film with nanoclay particles.

The invention is also directed to a method of preparing a relief image printing plate comprising the steps of:
 a) providing a photosensitive printing element comprising:
  (i) a support layer;
  (ii) one or more layers of a photocurable material deposited on the support layer;
  (iii) a slip film layer positioned on the one or more layers of photocurable material, the slip film layer comprising:
   (a) one or more polymeric binders;
   (b) a layered silicate; and
   (c) optionally, a surfactant;
 b) placing a negative artwork on top of the slip film layer of the photosensitive printing element;
 c) exposing the photosensitive printing element to actinic radiation through the negative artwork, wherein the areas of the one or more layers of photocurable material that are exposed to actinic radiation crosslink and cure; and
 d) developing the photosensitive printing element to remove uncured portions of the photocurable material to create a relief image on the printing plate.

In the alternative, a U.V. absorbing material can be included in the slip film layer, thereby allowing the slip film layer to act a both a slip film and an in-siter mask. The slip film layer with the U.V. absorbing material can then be selectively ablated using a laser in the desired image. In most applications in this regard, the slip film will be ablated using an infrared laser. As a result, it is advantageous to include an infrared absorbing material such as carbon black in the slip film. In this regard, reference is made to U.S. Pat. Nos. 5,925,500; 5,262,275 and 6,238,837, the teachings each of which are incorporated herein in their entirety. In this form, the invention is directed to a method of preparing a relief image printing plate comprising the steps of:
a. providing a photosensitive printing element comprising:
  (i) a support layer;
  (ii) one or more layers of a photocurable material deposited on the support layer;
  (iii) a slip film layer positioned on the one or more layers of photocurable material, said slip film layer comprising;
    (a) one or more polymeric binders;
    (b) a layered silicate;
    (c) a U.V. radiation absorbing material; and
    (d) optionally, a surfactant;
b. selectively ablating portions of the slip film layer in the image desired using a laser;
c. exposing the photosensitive printing element to actinic radiation;
d. developing the photosensitive printing element to remove uncured portions of the photocurable material;

Thereby creating a relief image printing plate.

The photosensitive printing element may be developed by washing the photosensitive printing element with a solvent or water. Alternatively, the photosensitive printing element may be developed by heating the photosensitive printing element and contacting the heated photosensitive printing element with a material to remove melted or softened uncured photocurable material to reveal the relief image.

Depending on the type of developing that is used to create the relief image, different photosensitive resin compositions may be used. When thermal development is used, it is necessary that the composition of the photosensitive material be such that there exists a substantial difference in the melt temperature between the cured and the uncured photopolymer to enable the uncured photopolymer to be removed when the photosensitive printing element is heated and contacts with a material that will remove the uncured photopolymer.

The improved slip film composition of the invention provides improved thermal processing characteristics when used in a thermally developable system. The addition of the layered silicate to the slip film composition provides the slip film layer with an effective filling agent, and the cohesiveness of the film formed by the polymer resin is thus altered. The ability to form microcracks in the surface, enabling proper release of the slip film from the photosensitive layer, is enhanced, enabling the photosensitive resin to be properly thermally processed. Without the addition of the layered silicate, the polymer resin acts like a hot melt adhesive on top of the cured photosensitive layer, with adhesion that is too great so that either the photosensitive layer will not release or that the blotter material itself sticks and then tears.

The invention will now be described with reference to the following non-limiting examples.

EXAMPLES

1) Sample preparation: the nanoclays examined in these examples were provided by Southern Clay Products, Inc. under the tradenames of Cloisite® Na+, 25A, and 15A in the order of increasing hydrophobicity.

The formulations prepared are listed in Table 1. The formulations are designed to reveal the effects of the presence of nanoclay particles on the performance of the slip film by examining the presence of nanoclay particles, the amount of nanoclay particles in the composition, and the hydrophilic/hydrophobic nature of the various nanoclay particles.

TABLE 1

Formulations of various slip-film compositions

| Component % | XPS N7 | XPS N8 | XPS N9 | XPS N10 | XPS N11 | XPS N12 | XPS N13 |
|---|---|---|---|---|---|---|---|
| IPA[1] | 50.77 | 50.77 | 50.77 | 50.77 | 50.77 | 50.77 | 50.77 |
| DI[2] water | 41.78 | 41.63 | 41.63 | 41.63 | 41.14 | 41.14 | 41.14 |
| Versamid 115[3] | 0.15 | 0.15 | 0.15 | 0.15 | 0.15 | 0.15 | 0.15 |
| Klucel L[4] | 7.25 | 7.25 | 7.25 | 7.25 | 7.25 | 7.25 | 7.25 |
| T Det N 1007[5] | 0.05 | 0.05 | 0.05 | 0.05 | 0.05 | 0.05 | 0.05 |
| Cloisite Na+ | X | 0.15 | X | X | 0.64 | X | X |
| Cloisite 25A | X | X | 0.15 | X | X | 0.64 | X |
| Cloisite 15A | X | X | X | 0.15 | X | X | 0.64 |

[1]Isopropyl alcohol
[2]Deionized water
[3]Polyamide resin, available from Cognis Corporation
[4]Hydroxypropyl cellulose, available from Hercules Powder Co.
[5]Ethoxylated nonyl phenol surfactant, available from Harcros Organics As is readily seen, XPS N7 contains no nanoclay, XPS N8-N10 include 2% of nanoclay in the solids (including Klucel® L, Versamid® 115, and T Det N 1007) and XPS N11-N13 8%, respectively.

The slip film formulations were coated onto Mitsubishi Hostaphan® 2307 films using a #50 wire-rod at room temperature. The thus formed slip films were then inserted in an air-circulation (60° C.) oven for several minutes. The thickness of the slip films varied from 1.8 to 3.8 μm. The slip films were lamination on BAX plates (RTF 2002-0084) at 115° C. in a press for several minutes. Prior to the lamination of the slip films, XPS N7-N13, the original slip films (2% standard) on BAX were removed from the plates.

2) Coversheet release: one-inch wide strips were cut from each plate in order to evaluate the initiation of slip film transfer to the resin. Once the initiation is complete, the peel force needed for propagation was less than 5 grams for all the samples.

3) Imaging: 45 seconds of back exposure was utilized to build a floor in each plate of approximately 65 mil. Face exposure time was varied ranging from 5 to 35 minutes in order to characterize the image quality, including maximum holding time (MHT), reverse depth, and dot angle with respect to exposure time.

4) Reverse depth and dot angle measurements: cross sections of reverse lines and dots were cut from the plates with the cross section facing upward under a Nikon Measurescope UM-3. The reverse depths and dot angles were determined over the various exposure times.

5) Slip film thickness and roughness measurements: the thickness and local roughness of the slip films were determined by the Veeco WYKO NT3300 Profiling System equipped with the analysis software of Vision 32. In order to evaluate thickness uniformity, which can be a measure of processibility of the slip film solutions, the thickness of the slip film was measured at nine different locations on each slip film.

6) Negative release: 45 seconds of back exposure was utilized. Two or three pieces of roughly 2×2 in² negative artwork were placed on the face of the plates. The plates were then imaged for 20 minutes under vacuum (9 in. Hg). After imaging, the pieces of negative artwork were peeled off the plates in order to evaluate the behavior of the negative artwork-release.

7) Washout: the plates were washed in a rotary washout unit for 20 minutes in order to evaluate the washout properties.

8) Drying, post exposure, and detack: after washing, the plates were dried at 65° C. in a 3040 Dryer, Flex-light Processing Equipment overnight, followed by post exposure and detack for 10 minutes, respectively, in a Multi-exposure/Anti-tack unit, available from Anderson Veerland.

Results and Discussion:

1) Negative artwork release: negative artwork-release immediately after imaging has been improved in the nanoclay-filled slip films for both overnight and 2-week aged samples. Table 2 displays the local roughness of the slip films. The roughness is seen to increase with increasing content of nanoclay. It is considered that the enhanced negative artwork-release originates from the rougher surface of the nanoclay-filled slip films. The rougher surface may potentially prevent the negative artwork from forming intimate adhesion to the slip films during the imaging process. In addition, the nanoclay particles embedded in the slip films create a drier surface, which is believed to positively influence the negative artwork-release. Both 2% and 8% nanoclay contents show similar behavior of the negative artwork-release, which implies that the effect of enhancement levels off with respect to nanoclay contents between about 2% and about 8%.

TABLE 2

Local roughness of the slip films

|  | XPS N7 | XPS N8 | XPS N9 | XPS N10 | XPS N11 | XPS N12 | XPS N13 |
| --- | --- | --- | --- | --- | --- | --- | --- |
| Roughness (nm) | 253 | 435 | 485 | 917 | 1030 | 1070 | 1150 |

2) Image quality: Table 3 illustrates the minimum holding time (MHT) of the slip films. THE MHT's of 2% nanoclay (XPS N8-N10) are the same as that of the unfilled slip film (XPS N7), which indicates that the image speed is not influenced by the presence of the 2% nanoclay. However, the MHT's of 8% (XPS N11-N13) slightly increased (~1 minute) compared to the unfilled slip-film.

TABLE 3

Minimum Holding Time (MHT) of the slip films

|  | XPS N7 | XPS N8 | XPS N9 | XPS N10 | XPS N11 | XPS N12 | XPS N13 |
| --- | --- | --- | --- | --- | --- | --- | --- |
| MHT (min) | 10 | 10 | 10 | 10 | >10 | >10 | >10 |

Figure 1:
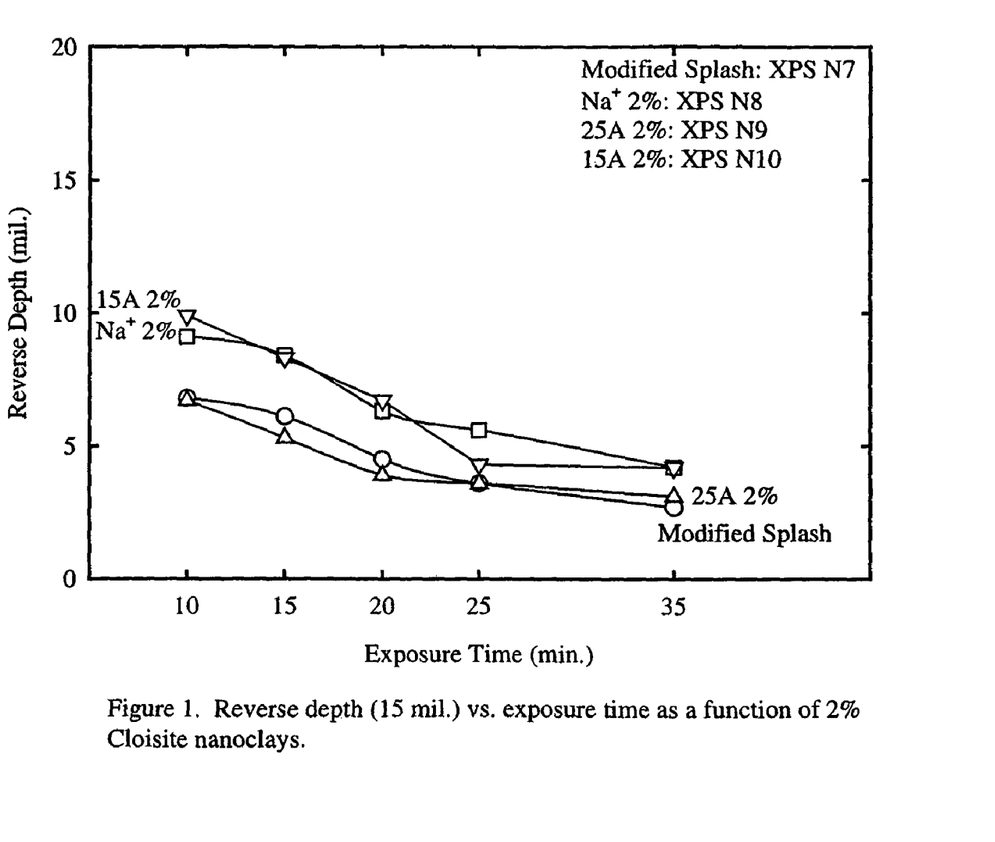
FIG. 1 illustrates values for reverse depth versus exposure time as a function of compositions containing 2% nanoclays.
Figure 2:
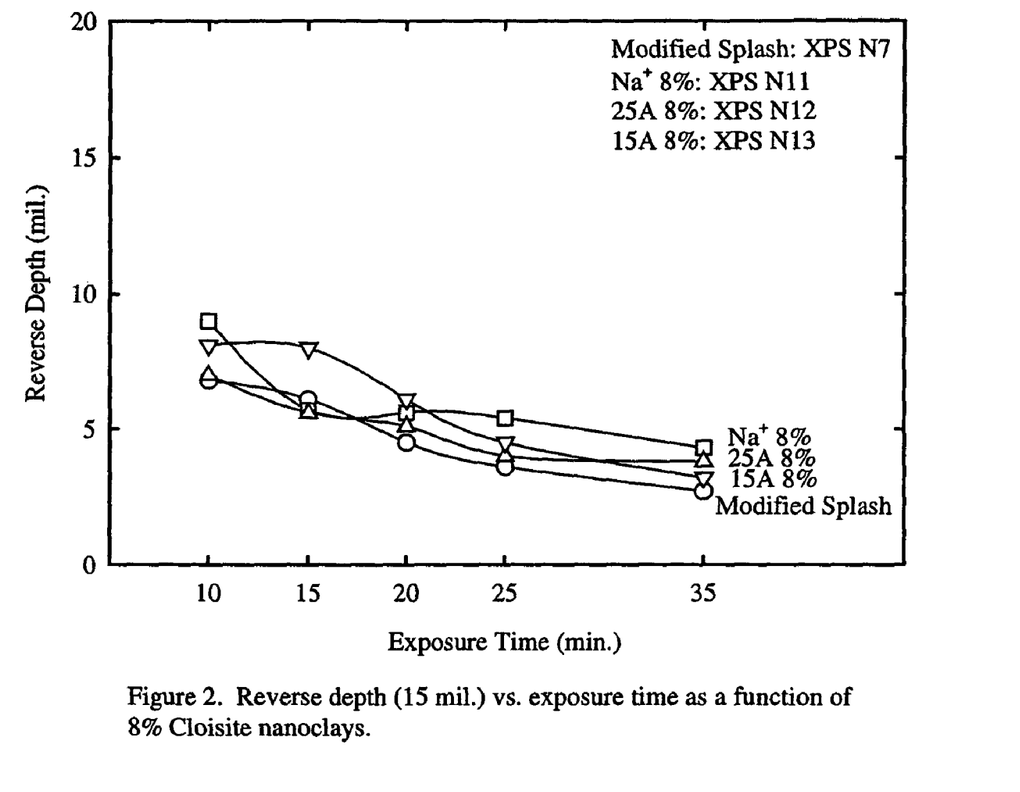
FIG. 2 illustrates values for reverse depth versus exposure time as a function of compositions containing 8% nanoclays.
Figure 3:
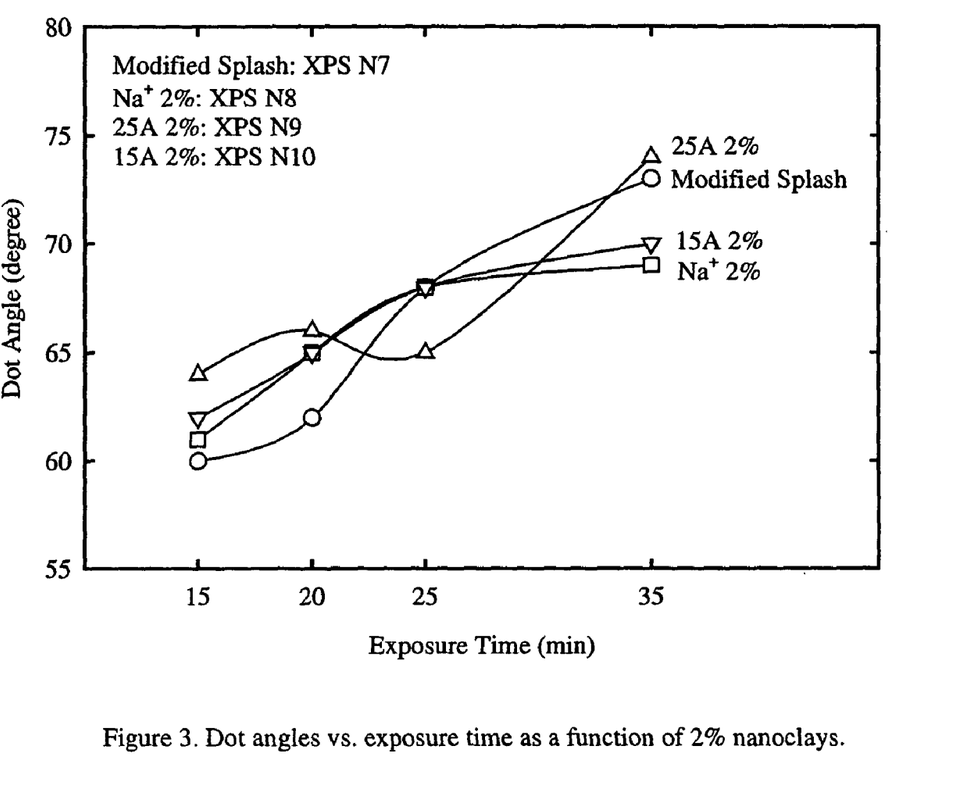
FIG. 3 illustrates values for Dot angles (degrees) versus exposure time as a function of compositions containing 2% nanoclays.
Figure 4:
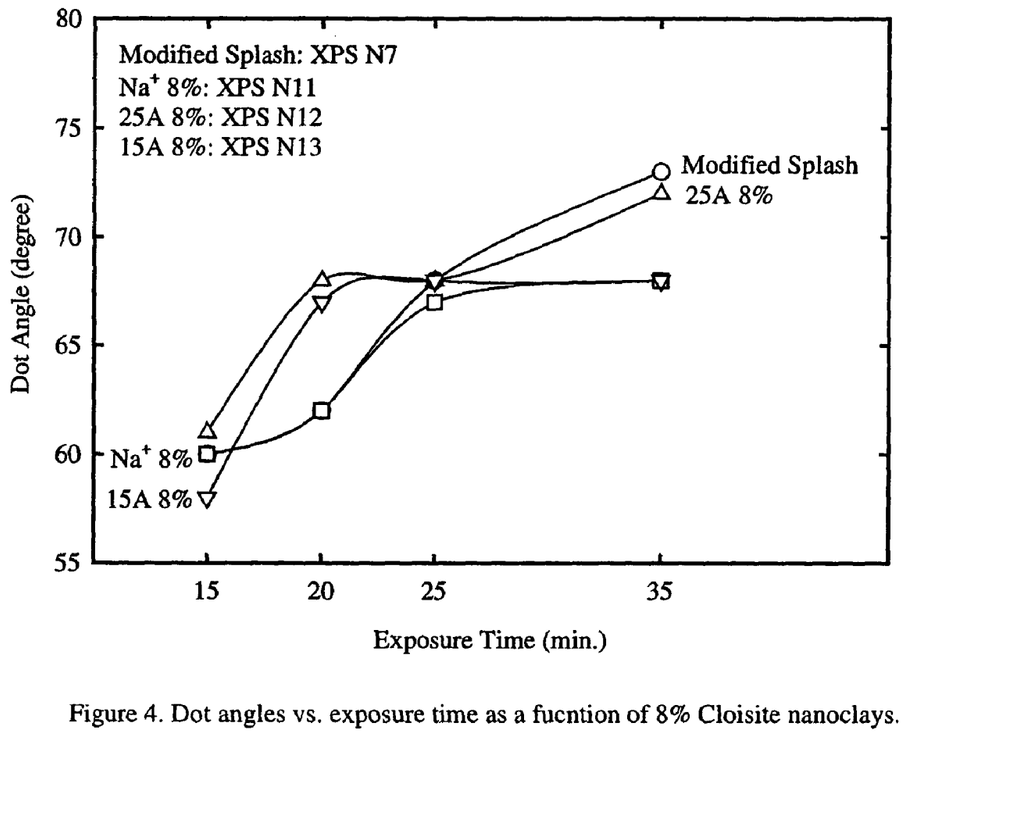
FIG. 4 illustrates values for Dot angles (degrees) versus exposure time as a function of compositions containing 8% nanoclays.

FIGS. 1 and 2 show that the reverse depths are larger in the nanoclay embedded slip films for both 2 and 8%. Especially, formulations which contain Cloisite® Na+ (XPS N8 and N11) and Cloisite® 15A (XPS N10 and N13) have larger reverse depths throughout the exposure times examined. FIGS. 3 and 4 demonstrate the growth of the dot angles with increasing exposure time. Interestingly, the dot angles increased rapidly at early stages for both Cloisite® Na+ and Cloisite® 15A, followed by leveling off at later stages. Considering that Cloisite® Na+ is hydrophilic while Cloisite® 15A is hydrophobic, there seems to be no effect of hydrophobic/hydrophilic nature on image quality.

Applicants have not yet determined what caused the larger reverse depths without sacrificing the image speed.

3) Processibility: Thickness uniformity throughout the slip film can be a measure of stability of the coating process. Table 4 shows the average thickness and standard deviation, as measured at nine different locations on each slip film. The filled slip films present much lower variations in thickness. This is due to the increased viscosity and reduced elasticity as a result of the presence of the nanoclay particles, which may impart more stable processibility to the filled slip film solutions.

TABLE 4

Local roughness of the slip films

|  | XPS N7 | XPS N8 | XPS N9 | XPS N10 | XPS N11 | XPS N12 | XPS N13 |
| --- | --- | --- | --- | --- | --- | --- | --- |
| Ave. | 3.983 | 2.946 | 3.003 | 3.565 | 2.814 | 2.979 | 2.674 |
| Std. Dev. | 1.064 | 0.374 | 0.430 | 0.474 | 0.358 | 0.398 | 0.482 |

No washout issue has been observed such as unwashed slip film and stains in all slip films.

With the presence of the nanoclay particles, the negative artwork-release because enhanced in all of the slip films investigated, due mainly to the rougher and drier surface. The reverse depths became larger at a given exposure time without adversely influencing the imaging speed. The growth of dot angles tends to be more rapid at early stages, followed by leveling off at later stages, resulting in small dot angles at later stages. The presence of nanoclay particles in the slip film compositions changed the Theological properties of the composition, which induced higher thickness uniformity throughout the slip film as a result of more stable processibility during the coating process.

What is claimed is:

1. A photosensitive printing plate comprising:
  a) a support layer;
  b) one or more layers of a photocurable material deposited on the support layer;
  c) a slip film layer positioned on the one or more layers of photocurable material, the slip film layer comprising:
    (i) one or more polymeric binders;
    (ii) a layered silicate, wherein the layered silicate is selected from the group consisting of phyllosilicates, micaceous minerals, mixed layered illite/smectite minerals, and combinations of the foregoing; and
    (iii) optionally, a surfactant; and
  d) optionally, a removable coversheet.

2. The photosensitive printing plate according to claim 1, wherein the one or more polymeric binders of the slip film layer are selected from the group consisting of polyacetals, polyacrylics, polyamides, polyimides, polybutylenes, polycarbonates, polyesters, polyethylenes, cellulosic polymers, polyphenylene ethers, polyethylene oxides, and combinations of the foregoing.

3. The photosensitive printing plate according to claim 2, wherein the one or more polymeric binders of the slip film layer are selected from the group consisting of polyamides, cellulosic polymers, and combinations of the foregoing.

4. The photosensitive printing plate according to claim 2, wherein the concentration of the one or more polymeric binders in the slip film layer is about 90% to about 97% by weight based on the total weight of the dry constituents.

5. The photosensitive printing plate according to claim 1, wherein the slip film layer also comprises a U.V. absorbing material.

6. The photosensitive printing plate according to claim 1, wherein the layered silicate of the slip film layer is a phyllosilicate and is selected from the group consisting of montmorillonite, bentonite, nontronite, biedellite, volkonskonite, hectorite, saponite, sauconite, sobockite, stevensite, svinfordite, vermiculite, and combinations of the foregoing.

7. The photosensitive printing plate according to claim 6, wherein the layered silicate of the slip film layer is a natural montmorillonite or a montmorillonite containing an organic modifier.

8. The photosensitive printing plate according to claim 6, wherein the concentration of the layered silicate in the slip film composition is about 1% to about 10% by weight based on the total weight of the dry constituents, not including one or more solvents.

9. The photosensitive printing plate according to claim 8, wherein the concentration of the layered silicate in the slip film composition is about 2% to about 8% by weight based on the total weight of the dry constituents, not including one or more solvents.

10. The photosensitive printing plate according to claim 1, wherein the surfactant is present in the slip film composition and comprises an ethoxylated nonyl phenol surfactant.

11. The photosensitive printing plate according to claim 10, wherein the surfactant is present in the slip film composition at a concentration of about 0.5% to about 1.0% by weight based on the total weight of the dry constituents, not including one or more solvents.

* * * * *